(12) United States Patent
Kwon et al.

(10) Patent No.: US 7,563,659 B2
(45) Date of Patent: Jul. 21, 2009

(54) METHOD OF FABRICATING POLY-CRYSTALLINE SILICON THIN FILM AND METHOD OF FABRICATING TRANSISTOR USING THE SAME

(75) Inventors: Jang-yeon Kwon, Seoul (KR); Min-koo Han, Seoul (KR); Se-young Cho, Seoul (KR); Kyung-bae Park, Seoul (KR); Do-young Kim, Gyeonggi-do (KR); Min-cheol Lee, Seoul (KR); Sang-myeon Han, Seoul (KR); Takashi Noguchi, Gyeonggi-do (KR); Young-soo Park, Gyeonggi-do (KR); Ji-sim Jung, Incheon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 324 days.

(21) Appl. No.: 11/003,326

(22) Filed: Dec. 6, 2004

(65) Prior Publication Data
US 2006/0008957 A1      Jan. 12, 2006

(30) Foreign Application Priority Data
Dec. 6, 2003   (KR) ............... 10-2003-0088423

(51) Int. Cl.
   *H01L 21/00*  (2006.01)
(52) U.S. Cl. ............... 438/166; 438/487; 257/E21.001
(58) Field of Classification Search ............... 438/166, 438/487
See application file for complete search history.

(56) References Cited

U.S. PATENT DOCUMENTS 6,312,979 B1 * 11/2001 Jang et al. ............... 438/166

OTHER PUBLICATIONS

S.D. Theiss, et al., "PolySilicon Thin Film Transistors Fabricated at 100°C on a Flexible Plastic Substrate", IEEE, 1998, pp. 257-260.
Y.J. Tung et al., "30.3: An Ultra-Low-Temperature Poly-Si TFT with Stacked Composite ECR-PECVD Gate Oxide", SID 98 Digest, 1998, pp. 887-890.
Lee et al., "Poly-Si TFT Fabricated at 150 °C Using ICP-CVD and Excimer Laser Annealing for Plastic Substrates", IEEE, pp. 8.7.1-8.7.4, Dec. 8-10, 2003.

* cited by examiner

Primary Examiner—Jack Chen
(74) Attorney, Agent, or Firm—Harness, Sickey & Pierce, P.L.C.

(57) ABSTRACT

A method of fabricating a poly-Si thin film and a method of fabricating a poly-Si TFT using the same are provided. The poly-Si thin film is formed at a low temperature using inductively coupled plasma chemical vapor deposition (ICP-CVD). After the ICP-CVD, excimer laser annealing (ELA) is performed while increasing energy by predetermined steps. A poly-Si active layer and a $SiO_2$ gate insulating layer are deposited at a temperature of about 150° C. using ICP-CVD. The poly-Si has a large grain size of about 3000 Å or more. An interface trap density of the $SiO_2$ can be as high as $10^{11}/cm^2$. A transistor having good electrical characteristics can be fabricated at a low temperature and thus can be formed on a heat tolerant plastic substrate.

5 Claims, 6 Drawing Sheets

METHOD OF FABRICATING POLY-CRYSTALLINE SILICON THIN FILM AND METHOD OF FABRICATING TRANSISTOR USING THE SAME

BACKGROUND OF THE DISCLOSURE

This application claims the priority of Korean Patent Application No. 2003-88423, filed on Dec. 6, 2003, in the Korean Intellectual Property Office, the disclosure of which is incorporated herein in its entirety by reference.

1. Field of the Disclosure

The present disclosure relates to a method of fabricating poly-Si thin film and a method of fabricating a transistor using the same, and more particularly, to a method of fabricating a poly-Si thin film having high mobility and a method of fabricating a transistor using the same.

2. Description of the Related Art

Poly-crystalline silicon (poly-Si) is applied to a variety of electronic devices such as flat panel displays and solar cells because it has greater mobility than amorphous silicon (a-Si). Generally, poly-Si electronic devices are formed on a substrate of a heat resistant material, such as glass. A method of fabricating a poly-Si electronic device on a plastic substrate has been recently developed. In order to prevent thermal deformations in the electronic device, it is necessary to use a low temperature layer forming process in which a poly-Si electronic device is formed at a low temperature. Such a low temperature process is required in order to prevent thermal shock to a substrate and to suppress process defects that occur at a high temperature in the fabrication process. The use of a plastic substrate for a flat panel display has been developed because the plastic substrate is lightweight, flexible and firm.

A poly-Si thin film transistor (TFT) can be formed on a plastic substrate. However, such a poly-Si TFT must be fabricated at a low temperature because a plastic substrate is heat intolerant.

For example, a method of depositing a material at a temperature of about 400° C. cannot be applied to the plastic substrate, which is thermally deformed at a temperature of 200° C. Methods proposed by Y. J Tung et. al and S. D. Theiss et. al cannot obtain a poly-Si thin film having a large grain size when using a process temperature below 200° C. and a silicon dioxide having a flat-band voltage close to 0 V. (Y. J Tung, X. Meng. T. J. King. P. G. Carey, P. M. Smith, S. D. Theiss, R. Weiss, G. A. Davis V. Aebi, *Tech, Digest of SID*98, pp. 887-890; D. D. Theiss, P. G. Carey, P. M. Smith, P. Wickboldt, T. W. Sigmon, Y. J. Tung, T. J King, *IEDM* 98, pp. 257-260)

A conventional poly-Si fabricating method uses chemical vapor deposition (CVD) or plasma enhanced CVD (PECVD). In such a deposition method, a-Si is deposited and then a poly-Si is obtained by annealing the a-Si. Thus, such a conventional method is necessarily accompanied with an annealing process in order to obtain the poly-Si.

SUMMARY OF THE DISCLOSURE

The present disclosure provides a method of fabricating a poly-Si thin film and a method of fabricating a TFT using the same, in which a poly-Si having a large grain size can be formed without depending on an annealing.

Also, the present disclosure provides a method of fabricating a poly-Si thin film with high electron mobility and a method of fabricating a TFT using the same.

Further, the present disclosure provides a method of fabricating at a low temperature a poly-Si TFT having a poly-Si layer having a large grain size and a gate insulating layer having a low flat-band voltage.

According to an aspect of the present disclosure, a method of fabricating a poly-Si thin film includes a forming of a silicon thin film on a substrate through ICP-CVD using a diluted He.

In another aspect of the present disclosure, there is provided a method of fabricating a TFT, which includes a substrate, a poly-Si active layer formed on the substrate, a gate insulating layer formed on the poly-Si active layer, and a gate formed on the gate insulating layer, wherein the method includes depositing a silicon thin film on the substrate by ICP-CVD using a diluted He.

In another aspect of the present invention, there is provided a method of fabricating a TFT, which includes a substrate, a poly-Si active layer formed on the substrate, a gate insulating layer formed on the poly-Si active layer, and a gate formed on the gate insulating layer, wherein the method includes depositing a silicon thin film on the substrate by ICP-CVD using a diluted He.

The diluted He may be an $He/SiH_4$ composition and a ratio of He to $SiH_4$ may be in a range from 6 to 12, preferably 10, that is, 20:2. A deposition ratio of silicon by the ICP-CVD may be 2.8 Å/sec. The poly-Si can be annealed using ELA, thereby increasing Si grain size. The ELA is performed while increasing energy by predetermined steps.

In the method of fabricating the TFT, ICP-CVD is used to form the gate insulating layer, and an annealing can be performed on the gate insulating layer. Also, ELA is used to anneal the gate insulating layer.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF THE DISCLOSURE

Hereinafter, a method of fabricating a poly-Si thin film and a method of fabricating a TFT using the same according to the present disclosure will be described in detail with reference to the accompanying drawings.

1. Deposition of Silicon Thin Film

High density plasma generated by inductively coupled plasma chemical vapor deposition (ICP-CVD) has a high deposition ratio. ICP-CVD uses remote plasma, which can reduce ion damage in a film-growth zone.

An active layer of a poly-Si TFT is formed by the ICP-CVD. At this time, He/SiH$_4$ gas diluted with He can be used. Also, a substrate temperature of 150° C. and a pressure of 22 mTorr are maintained. A ratio of He to SiH$_4$ is 10, that is, 20:2 [sccm], and a deposition rate is 2.8 Å/sec.

Figure 1:
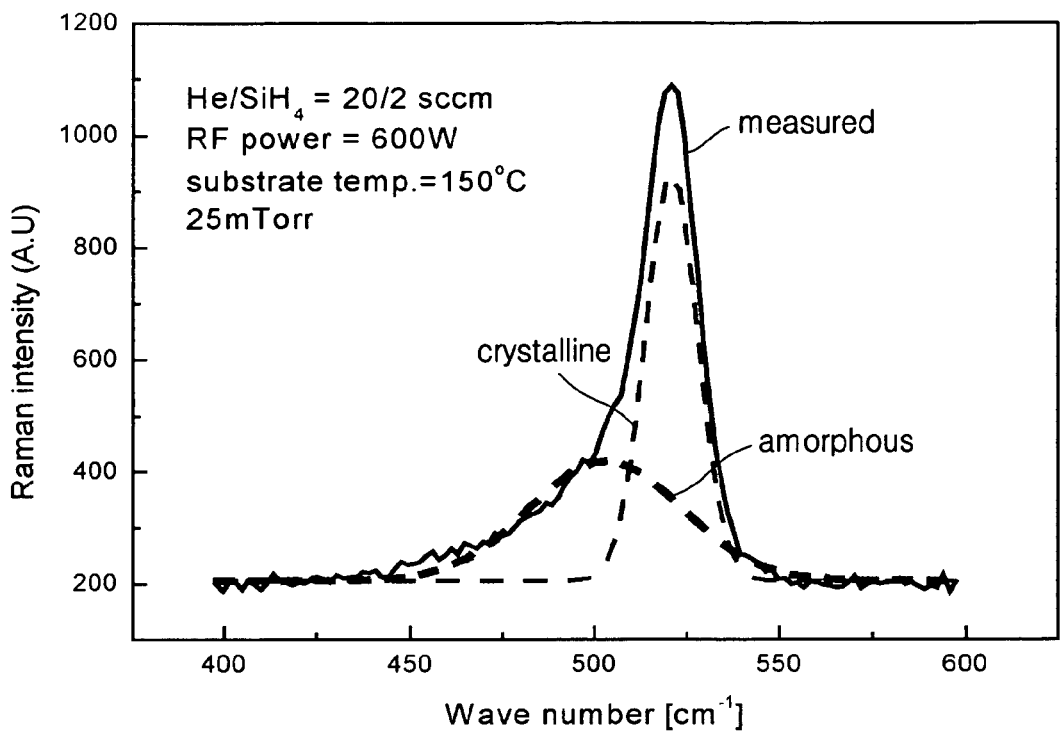
FIG. 1 is a graph illustrating a Raman spectrum of a silicon film according to an embodiment of the present disclosure.

FIG. 1 is a graph illustrating a Raman spectrum of a deposited silicon film. Referring to FIG. 1, it can be seen that the silicon film has a crystal structure, as indicated by a dominant peak of 520 cm$^{-1}$. An amorphous/intermediate phase is observed in the deposited silicon film.

About 60% crystal volume fraction and crystal component are obtained. The successful formation of the poly-Si film may be due to a reduction of ion bombardment in a film-growth zone, in which strong ions can obstruct crystal growth.

Figure 2:
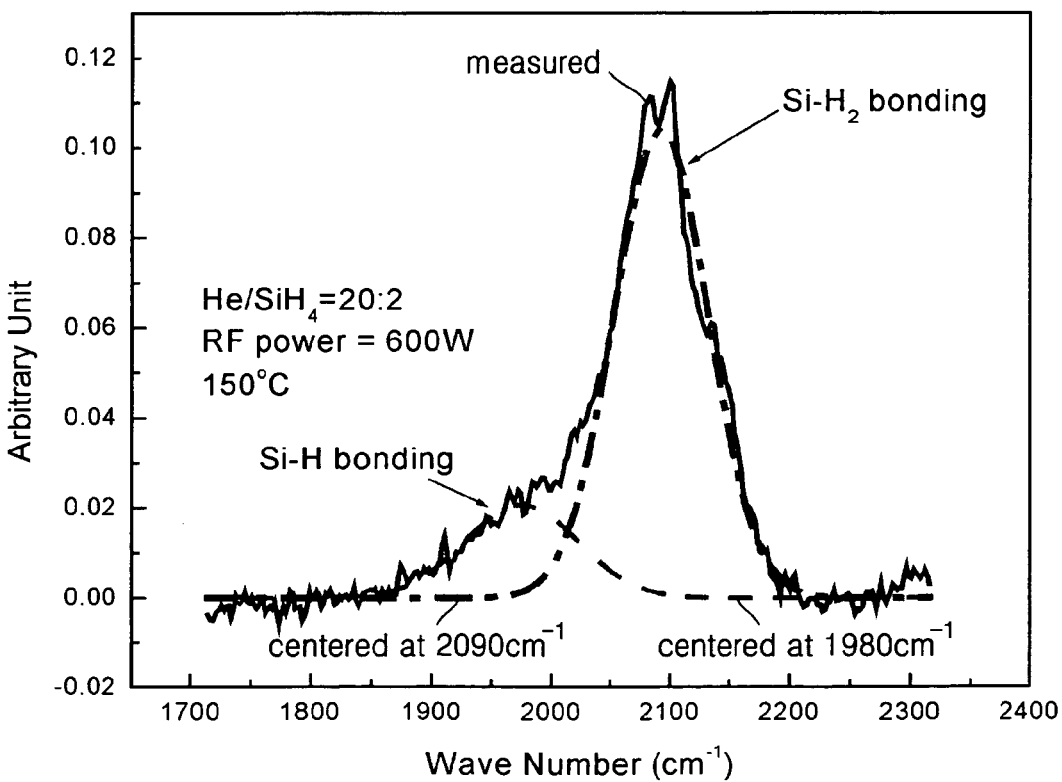
FIG. 2 is an FT-IR spectrum of a silicon thin film grown at a low temperature of 150° C. using ICP-CVD.

If hydrogen dilution is used when forming the silicon thin film, the concentration of hydrogen in the silicon thin film can reach 10-12%. However, due to high hydrogen concentration, an explosive effusion phenomenon of hydrogen can occur during excimer laser annealing (ELA). Therefore, it is desirable to reduce the hydrogen concentration. Referring to FIG. 2, the hydrogen concentration of the silicon film formed using the hydrogen dilution is calculated using FT-IR. Most of the hydrogen is in the form of dihydrides, that is, Si—H$_2$ (2090 cm$^{-1}$), and some of the hydrogen is in the form of a monohydride, that is, Si—H. However, the total hydrogen concentration is merely 4%. Such a reduction of the hydrogen concentration is caused by an inert gas, He, which reduces an energy barrier of a surface reaction.

2. Annealing Using ELA

The present embodiment involves the use of ELA instead of a furnace. The silicon thin film formed using the ICP-CVD is annealed by an XeCl ($\lambda$=308 nm) excimer laser. In order to prevent an abrupt effusion of hydrogen, excimer laser irradiation increases stepwise from a low energy density (100 mJ/cm$^2$) to a high energy density (200 mJ/cm$^2$). An energy density increment is 10 mJ/cm$^2$ and thus the energy density can increase 10 steps from 100 mJ/cm$^2$.

Figure 3:
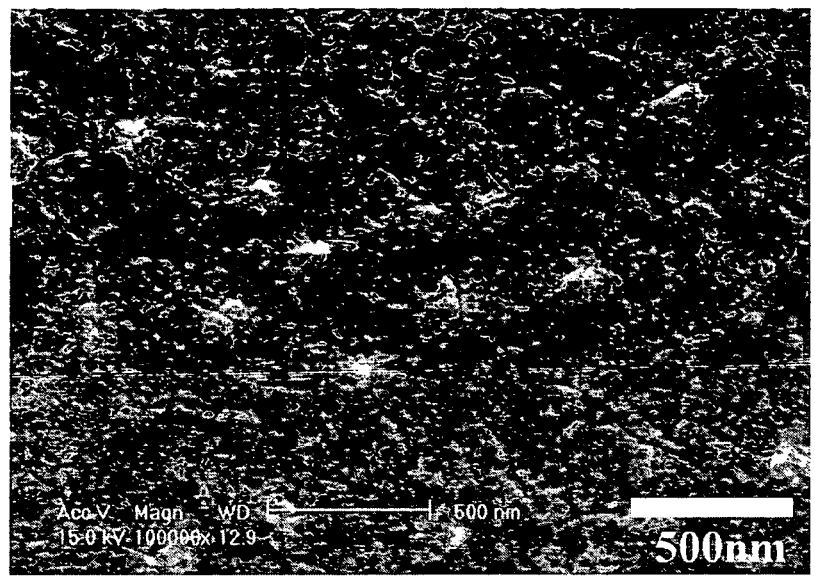
FIG. 3 is a SEM photograph illustrating a poly-Si thin film annealed using ELA according to an embodiment of the present disclosure.
Figure 4:
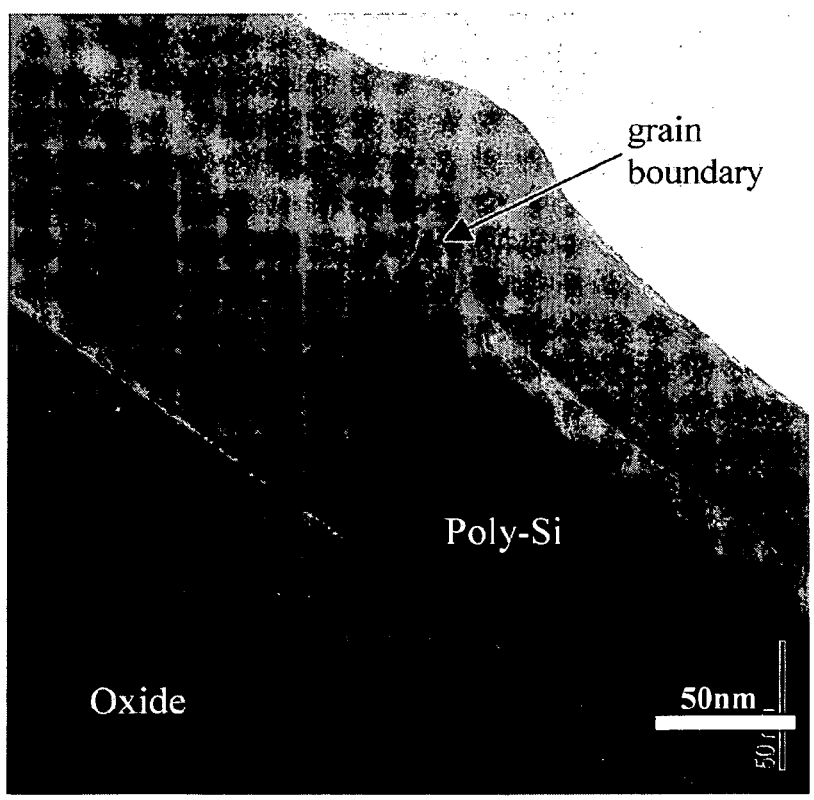
FIG. 4 illustrates a section of a poly-Si thin film recrystallized by ELA.

By increasing the energy density of excimer laser stepwise, dehydrogenation in the silicon thin film is progressed and recrystallization of silicon is progressed at the same time. FIG. 3 is a SEM photograph of an 800 Å-thick poly-Si thin film with large grains produced by the above-described ELA. Referring to FIG. 3, the poly-Si obtained by the ICP-CVD is recrystallized with a larger grain size by the ELA. FIG. 4 illustrates a section of the poly-Si thin film recrystallized by the ELA. It can be observed in FIG. 4 that the poly-Si is sufficiently recrystallized and a grain boundary formed by the ELA is clear.

The above two processes, that is, the deposition of the silicon thin film using the ICP-CVD and the annealing using the ELA, are associated with methods of fabricating a poly-Si thin film according to an embodiment of the present disclosure.

Processes described below are performed before the above two processes and are related to a method of fabricating a TFT, which is widely used as a dynamic switching device.

3. Deposition of Gate Insulating Layer

In order to fabricate a TFT that uses the above-described poly-Si as an active layer, an SiO$_2$ thin film is formed on the poly-Si as a gate insulating layer by ICP-CVD using He gas, N$_2$O gas and SiH$_4$ gas. At this time, a substrate temperature is maintained at 150° C. and a process pressure is set to 30 mTorr. A contents ratio of He:N$_2$O:SiH$_4$ is 100:20:5 [sccm].

Figure 5:
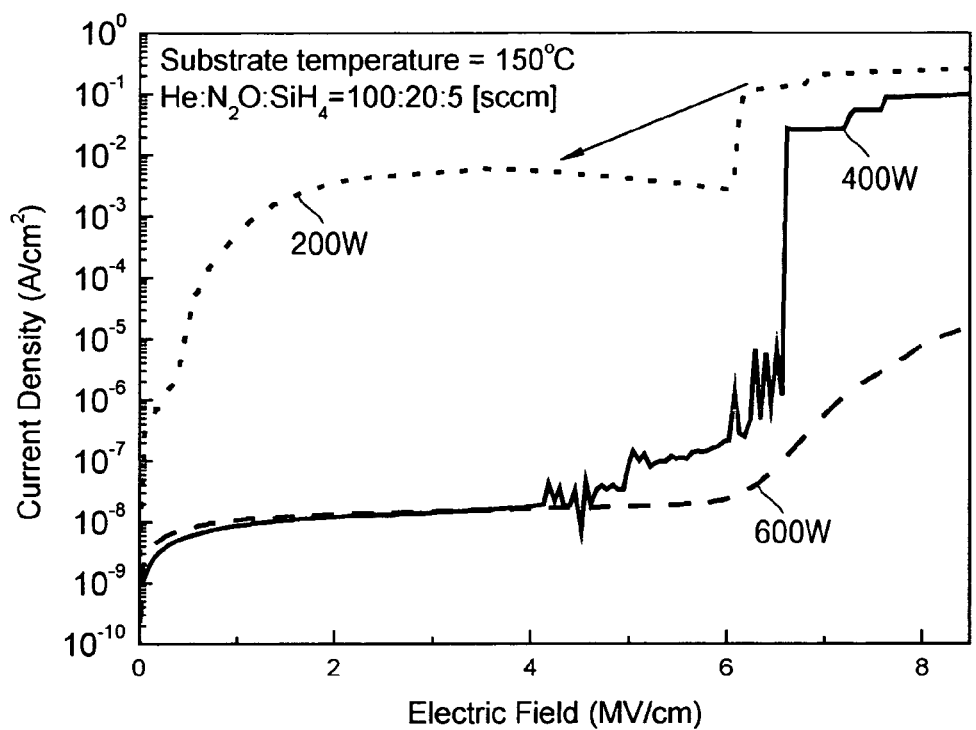
FIG. 5 is a graph illustrating a breakdown field of a gate insulating layer when RF power is 200 W, 400 W and 600 W.

FIG. 5 is a graph illustrating a breakdown field of the gate insulating layer when RF power is 200 W, 400 W and 600 W. Referring to FIG. 5, when the RF power is 400 W, a breakdown field is 6.2 MV/cm. Also, it can be seen that the breakdown field advantageously increases as the RF power increases.

Figure 6:
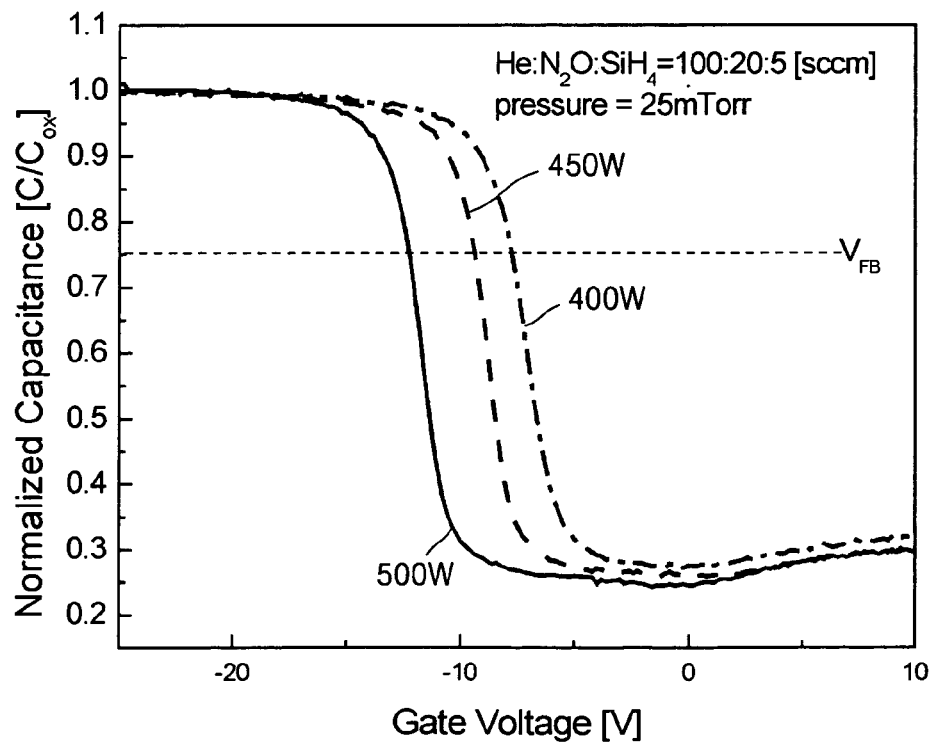
FIG. 6 is a graph illustrating C-V characteristic (measured with an LCR meter at 1 MHz) of an $SiO_2$ thin film formed by ICP-CVD.

FIG. 6 is a graph illustrating C-V characteristic of the SiO$_2$ thin film formed by ICP-CVD. The C-V characteristics were measured with an LCR meter at 1 MHz. FIG. 6 illustrates the characteristics of gate insulating layers deposited with RF powers of 400 W, 450 W and 500 W under a process pressure of 25 mTorr, and with a contents ratio of He:N$_2$O:SiH$_4$ is 100:20:5 [sccm].

Figure 7:
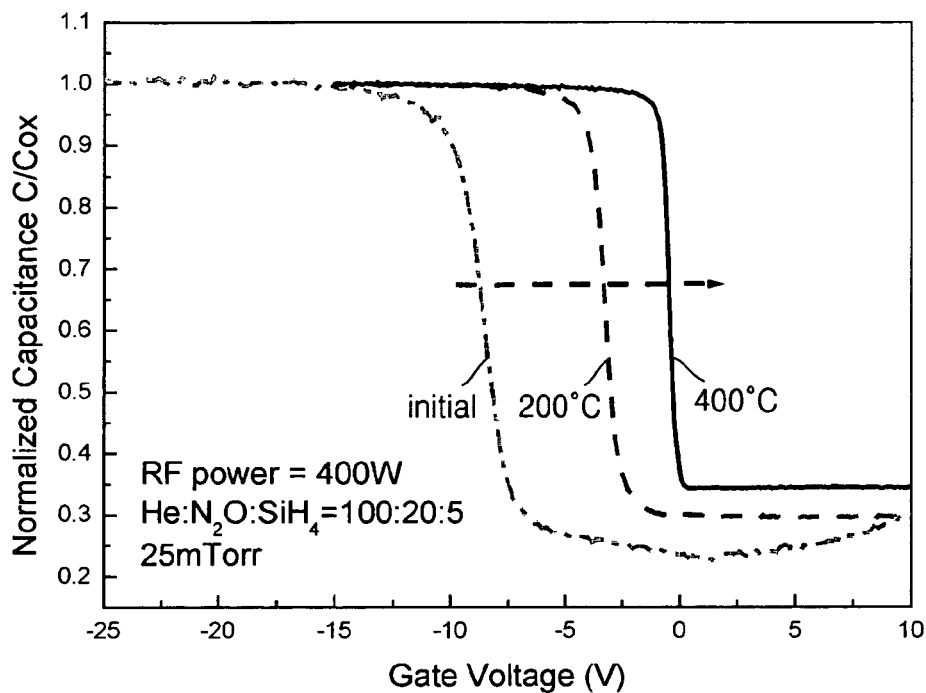
FIG. 7 is a graph illustrating C-V characteristic (measured with an LCR meter at 1 MHz) of two $SiO_2$ thin films.

Referring to FIG. 6, a flat-band voltage is below −5 V due to charges existing in the SiO$_2$ thin film and its surface. As the RF power is increased, the flat-band voltage is shifted in a negative direction. The charges that exist in the interface and the SiO$_2$ thin film are reduced as the RF power is reduced. An effective density of an interface trap is on the order of $10^{11}$/cm$^2$. FIG. 7 is a graph illustrating C-V characteristic (measured with an LCR meter at 1 MHz) of two SiO$_2$ thin films. A first SiO$_2$ thin film (initial) is deposited under conditions of 400 W of RF power, a contents ratio of He:N$_2$O:SiH$_4$=100:20:5, and a process pressure of 25 mTorr. A second SiO$_2$ thin film is annealed on a hot plate at a temperature of 200° C. and 400° C. Referring to FIG. 7, as the annealing temperature is increased, the flat-band voltage and the C-V characteristic are improved. Also, an interface trap density is remarkably improved. In other words, the annealing of the SiO$_2$ thin film used as the gate insulating layer is required in order to obtain an excellent poly-Si TFT. However, if the substrate for the TFT is composed of a plastic material, not a glass substrate, the temperature of the annealing must be properly adjusted in order to prevent the substrate from being deformed due to the heat generated during the annealing of the SiO$_2$ thin film.

Through various attempts to effectively anneal the SiO$_2$ thin film and prevent thermal deformation of the plastic substrate, a good result has been obtained by annealing the SiO$_2$ thin film using ELA. For convenience, the SiO$_2$ thin film is deposited on a silicon wafer under the above-described conditions using ICP-CVD, and then the ELA is performed. Consequently, a SiO$_2$ thin film having excellent C-V characteristic is obtained, as indicated by FIG. 8.

Figure 8:
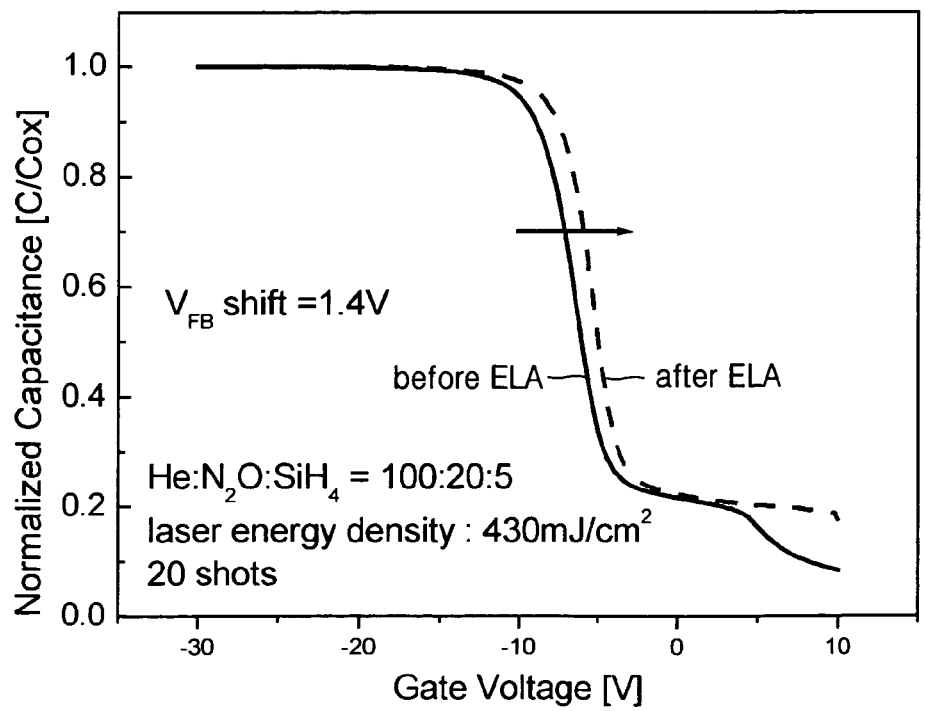
FIG. 8 is a graph illustrating C-V characteristic of an $SiO_2$ thin film before ELA and after ELA.

FIG. 8 is a graph illustrating the C-V characteristic of the SiO$_2$ thin film before ELA and after ELA. During the ELA, 20 shots of the laser were irradiated with an energy density of 430 mJ/cm$^2$. As a result, the flat-band voltage shifted by +1.4 V. Therefore, the charges existing in the interface or the SiO$_2$ thin film were reduced.

4. Brief Description of Entire Process of Fabricating TFT

The above three processes are the most important processes in TFT fabrication. The other processes are performed using conventional methods. These methods will now be briefly described.

In the TFT fabrication method according to an embodiment of the present disclosure, a poly-Si film and a SiO$_2$ film are fabricated at a low temperature of 150° C. Therefore, a TFT having excellent characteristics can be obtained on a heat intolerant substrate, for example, a plastic substrate. In other words, the plastic can be used as the TFT substrate.

Figure 9:
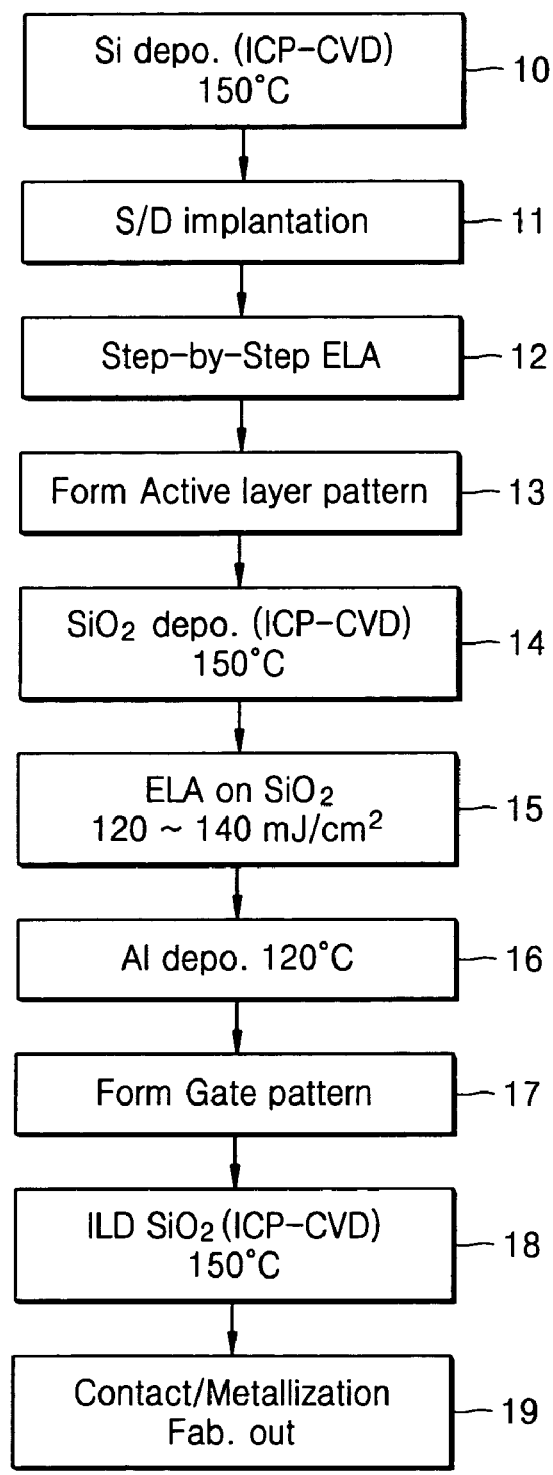
FIG. 9 is a flowchart illustrating a method of fabricating a TFT according to an embodiment of the present disclosure.

Referring to FIG. 9, first, Si is deposited on the substrate, which may be a glass substrate or plastic substrate (operation 10). ICP-CVD is performed under the conditions described above in Deposition of Silicon Thin Film, thereby forming the poly-Si silicon on the substrate. One technical aspect of the present disclosure is the direct attainment of the poly-Si through the deposition without any annealing.

After the deposition of the poly-Si, a source/drain impurity is implanted in the poly-Si to form an active layer (operation 11), and then, step-by-step ELA is performed under the conditions described above in Annealing Using ELA (operation 12).

Then, the poly-Si is patterned in the form of the active layer (operation 13). The patterning is performed by dry etching, such as a reactive ion etching (RIE).

After the active layer is patterned, a $SiO_2$ thin film to be used as a gate insulating layer is formed under the conditions described above in Deposition of Gate Insulating Layer (operation 14). During this process, the ELA is performed on the $SiO_2$ thin film (operation 15). In the annealing of the $SiO_2$ thin film, the laser is irradiated with an energy density of 120-140 mJ/cm$^2$.

After the $SiO_2$ gate insulating layer is formed, a metal film such as an Al film is deposited at a temperature of 120° C. (operation 16) and then patterned to form the gate (electrode) (operation 17).

Then, $SiO_2$ is deposited on the resultant structure as an intermetal dielectric at a temperature of 150° C. by ICP-CVD (operation 18). Then, a contact hole is formed and a metallization is performed, thereby forming the poly-Si TFT (operation 19).

Table 1 shows sheet resistances of the doped Si thin films annealed under the different ELA conditions. A first row illustrates a case when 10 shots of the excimer laser at 110 mJ/cm$^2$ were irradiated. In this case, the sheet resistance was 1138 Ω/sq. A second row illustrates a case when 10 shots of the excimer laser at 120 mJ/cm$^2$ were irradiated. In this case, the sheet resistance was 830 Ω/sq. A third row illustrates a case when the energy density is incrementally increased. In this case, the excimer laser is irradiated ten times at an energy density of 110 mJ/cm$^2$, five times at 140 mJ/cm$^2$, and five times at 160 mJ/cm$^2$. The sheet resistance in this case was 224 Ω/sq.

TABLE 1

| Laser Energy Density (mJ/cm$^2$) | Number of Shots | Sheet Resistance (Ω/sq) |
| --- | --- | --- |
| 110 | 10 | 1138 |
| 120 | 10 | 830 |
| 110 + 140 + 160 | 10 + 5 + 5 | 224 |

Figure 10:
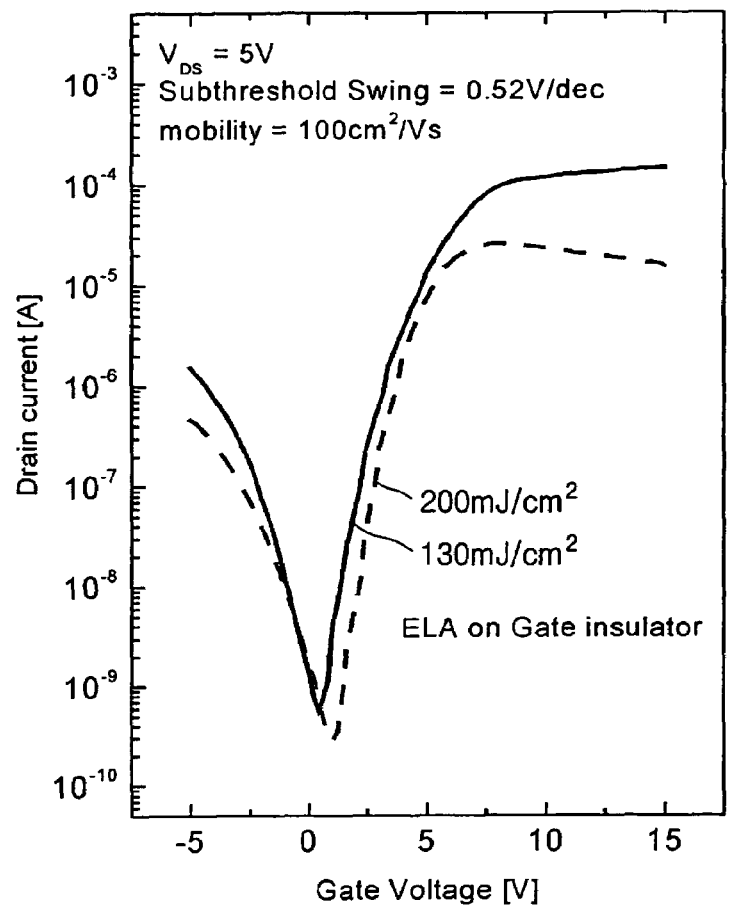
FIG. 10 is a graph illustrating electrical characteristics of a poly-Si TFT according to an embodiment of the present disclosure.
Figure 11:
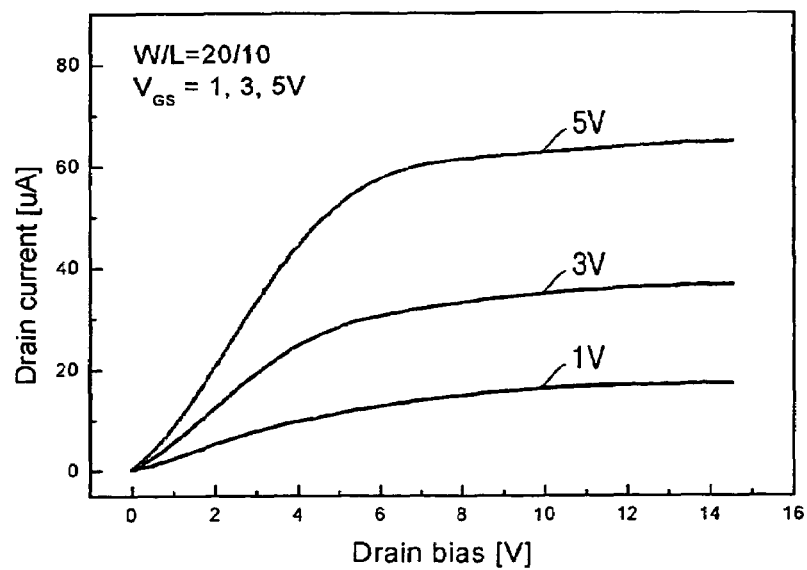
FIG. 11 is a graph illustrating a drain current with respect to a drain bias when a gate-source voltage ($V_{GS}$) of a TFT according to an embodiment of the present disclosure is 1 V, 3 V and 5V.

FIGS. 10 and 11 illustrate electrical characteristics of the poly-Si TFT according to an embodiment of the present disclosure and a prior art poly-Si TFT having a mobility of 100 cm$^2$/Vs. The electrical characteristics of the TFT according to an embodiment of the present disclosure are summarized in Table 2 below.

TABLE 2

| TFT Parameters | Typical Value (max. or min. value) |
| --- | --- |
| Ion ($V_{GS}$ = 15 V, $V_{DS}$ = 5 V) [μm] | 140 (200) |
| Mobility [cm$^2$/Vs] | 107 (140) |
| Minimum off current [nA] ($V_{DS}$ = 5 V) | 0.4 (0.1) |
| Subthreshold Swing [V/dec] | 0.76 (0.52) |
| On/Off current ratio | 5 × 10$^5$ (1 × 10$^6$) |

As shown in Table 2, the maximum mobility of the TFT according to an embodiment of the present disclosure is 140 cm$^2$/Vs, while the conventional mobility is 100 cm$^2$/Vs. Also, the subthreshold swing is 0.52 V/dec. It is noted that an annealing or post-annealing is not performed on the TFT according to an embodiment of the present disclosure. According to the analysis of the effect of the laser device on the gate insulating layer, when an excimer laser irradiates light with an energy density of 120-140 mJ/cm$^2$, preferably 130 mJ/cm$^2$, the electrical characteristics of the TFT are improved, as illustrated in FIG. 10. If the energy density is increased to 200 mJ/cm$^2$, the electrical characteristics are degraded, resulting in a large reduction in the drain current. This may result from an occurrence of a defect in the gate insulating layer resulting from the laser irradiation with the excessive energy density.

FIG. 11 is a graph illustrating a drain current with respect to a drain bias when a gate-source voltage ($V_{GS}$) of the TFT according to an embodiment of the present disclosure is 1 V, 3 V and 5V. In FIG. 11, three curves correspond to the gate-source voltages ($V_{GS}$) of 1 V, 3 V and 5 V from below, respectively. In this case, width and length of the gate are 20 μm and 10 μm, respectively.

As described above, the present disclosure can be used to produce a ploy-Si instead of a-Si by forming a Si thin film at a low temperature of 150° C. using a He/SiH$_4$ gas through ICP-CVD. A grain size of the poly-Si is large by selectively and additionally performing ELA, thereby improving electrical characteristics. For example, mobility of a TFT fabricated according to an embodiment of the present disclosure can be higher than 100 cm$^2$/Vs.

The method of fabricating a poly-Si thin film according to the present disclosure can be applied to a flat panel display, particularly to an AMLCD (active-matrix liquid-crystal display), an AMOLED (active-matrix-organic light-emitting display), a solar cell, or a semiconductor memory, which uses a plastic substrate. Such a poly-Si thin film is adapted for use in a TFT, which requires a high mobility and fast response speed and uses a plastic substrate. Such a TFT can be applied to any electronic device, including an AMLCD, an AMOLED, a switching device and an amplifying device.

What is claimed is:

1. A method of fabricating a silicon thin film, the method comprising forming the silicon thin film on a substrate by inductively coupled plasma chemical vapor deposition (ICP-CVD) using a diluted He,
   wherein the diluted He is an He/SiH$_4$ composition and a ratio of He to SiH$_4$ is in a range from 6 to 12 and a deposition rate of silicon by the ICP-CVD is 2.8 Å/sec.

2. The method of claim 1, further comprising annealing the deposited silicon thin film.

3. The method of claim 2, wherein the annealing is excimer laser annealing (ELA).

4. The method of claim 3, wherein the ELA is performed while increasing energy by predetermined steps.

5. The method of claim 1, further comprising maintaining the substrate at a temperature of 150° C. and at a pressure of 22 mTorr until said silicon thin film is formed.

* * * * *